United States Patent
Yamaguchi et al.

(10) Patent No.: US 6,903,368 B2
(45) Date of Patent: Jun. 7, 2005

(54) THIN-FILM TRANSISTOR DEVICE, ITS MANUFACTURING PROCESS, AND IMAGE DISPLAY USING THE DEVICE

(75) Inventors: Shinya Yamaguchi, Mitaka (JP); Mutsuko Hatano, Kokubunji (JP); Takeo Shiba, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 149 days.

(21) Appl. No.: 10/190,670

(22) Filed: Jul. 9, 2002

(65) Prior Publication Data

US 2003/0089907 A1 May 15, 2003

(30) Foreign Application Priority Data

Oct. 12, 2001 (JP) .................................... 2001-314719

(51) Int. Cl.[7] .............................................. H01L 31/20
(52) U.S. Cl. .......................... 257/57; 257/59; 257/521; 257/527; 438/149; 438/158
(58) Field of Search ........................... 257/57, 59, 75, 257/521; 527/527, 628; 438/49, 258, 149

(56) References Cited

U.S. PATENT DOCUMENTS

| | | | | |
|---|---|---|---|---|
| 5,371,381 A | * | 12/1994 | Sugahara et al. | 257/75 |
| 5,808,318 A | * | 9/1998 | Masumo et al. | 257/66 |
| 5,895,933 A | * | 4/1999 | Zhang et al. | 257/49 |
| 5,976,959 A | * | 11/1999 | Huang | 438/487 |
| 6,501,095 B2 | * | 12/2002 | Yamaguchi et al. | 257/57 |

FOREIGN PATENT DOCUMENTS

| | | |
|---|---|---|
| JP | 07-249592 | 3/1994 |
| JP | 07-321339 | 6/1994 |
| JP | 08-055808 | 8/1994 |
| JP | 10-199808 | 1/1997 |
| JP | 10-041234 | 3/1997 |
| JP | 11-345783 | 6/1998 |

OTHER PUBLICATIONS

Physics and Properties of Semiconductors–A Resume, Carrier Transport Phenomena, Chart on p. 29, pp. 28–29.

* cited by examiner

*Primary Examiner*—David Nelms
*Assistant Examiner*—Long Tran
(74) *Attorney, Agent, or Firm*—Reed Smith L.L.P.; Stanley P. Fisher, Esq.; Juan Carlos A. Marquez, Esq.

(57) ABSTRACT

A thin film made of silicon or another IV-group crystals (crystals and mixed crystals of C, Ge, Sn, and Pb) is twice scanned with a laser beam moving in two lateral directions in which crystal grains grow larger in order to form high-quality polycrystals in exact positions in the thin film, while defects uncontrollable by the prior arts are being reduced significantly, to realize a high-quality TFT device. The laser-scanning directions are defined by the crystallization face orientations.

8 Claims, 10 Drawing Sheets

THIN-FILM TRANSISTOR DEVICE, ITS MANUFACTURING PROCESS, AND IMAGE DISPLAY USING THE DEVICE

FIELD OF THE INVENTION

This invention relates to a thin-film transistor device comprising thin-film transistors formed on a thin film of polycrystalline silicon heat-treated at low temperature and laser-scanned twice at two directions defined in conjunction with at least two crystallization face orientations. The invention also relates to a manufacturing process of the thin-film transistor device and an image display using the thin-film transistor device.

BACKGROUND OF THE INVENTION

The existing matrix thin film for thin-film transistors consists of a quartz substrate and polycrystalline silicon of relatively large grain size (500–600 nm) formed on the substrate by heat treatment at the temperature of 900° C. or so (hereinafter referred to as "high-temperature polycrystalline silicon"). Using well-crystallized polycrystalline silicon of low grain-boundary density as their channels, thin-film transistors formed on a thin film of high-temperature polycrystalline silicon have electron mobility of 200–350 $cm^2$/Vs, which is close to the electron mobility of thin-film transistors formed on singlecrystalline silicon (up to 500 $cm^2$/Vs, S. M. Sze, Physics of Semiconductor Devices, p. 29, Second Edition, Wiley). However, the thin film of high-temperature polycrystalline silicon has to be formed on a quartz substrate which can withstand heat treatment at high temperature but is expensive, the production cost of thin-film transistors formed on the thin film is relatively high, which limits the market size of the transistors.

Many researchers have recently been conducted to establish a method for forming polycrystalline silicon on a substrate through low-temperature heat treatment (hereinafter referred to as "low-temperature polycrystalline silicon"). According to the method, a thin film of amorphous silicon is formed on an inexpensive substrate of glass or plastic by plasma CVD (chemical vapor deposition) or the like and the amorphous silicon is annealed into polycrystalline silicon with an excimer laser. This method enables forming the thin film of polycrystalline silicon at low temperature (up to 150° C.) thereby producing thin-film transistors at low cost. Compared with high-temperature polycrystalline silicon, however, the grain size of low-temperature polycrystalline silicon is smaller. Besides, the face orientations of crystal grains of low-temperature polycrystalline silicon are at random. If the size of crystal grains of polycrystalline silicon is small, the grain-boundary density in carrier channels is high. If the face orientations of crystal grains of polycrystalline silicon are at random, the trap-level density at grain boundaries is relatively high. In either case, the characteristic of transistors is affected. Accordingly, the electron mobility of thin-film transistors formed on substrates of low-temperature polycrystalline silicon is limited to 150 $cm^2$/Vs or so, resulting in the low operating speed of elements thereby limiting the number of kinds of elements formable on a single glass-based (or plastic-based) substrate. For example, pixels of an image display can be formed on the glass-based (or plastic-based) substrate, but other circuit elements, such as source drivers, gate drivers, shift registers, and peripheral control units, have to be formed on a conventional printed circuit board to be connected to the substrate with wires. It results in a smaller image-displaying unit but high manufacturing cost.

A technology to increase the size of crystal grains and to uniform the positions and face orientations of crystal grains is in demand. Various techniques have been proposed to increase the grain size and to regulate the positions and face orientations of crystal grains of low-temperature polycrystalline silicon. JP-A-345783/1999 discloses a technique of scanning silicon with a laser beam twice or more at 5–90°; JP-A-249592/1995 discloses a technique of turning a laser beam by (n/2+¼) to scan silicon with twice or more. JP-A-199808/1998 discloses a technique of scanning silicon with a laser beam twice or more at 90°. These techniques apply heat energy to silicon crystals repeatedly so as to anneal them for high quality. On the other hand, the present invention is to crystallize silicon by scanning silicon with laser beams devised based on the structure and growth mechanism of silicon crystals. In addition to the above prior art references, JP-A-321339/1995 discloses a technique of forming polycrystalline silicon with {111} axes in the carrier-moving direction by introducing into a thin film of amorphous silicon on an insulating substrate with metallic elements which foster crystallization selectively and cause crystals to grow in parallel with the insulating substrate. JP-A-41234/1998 discloses a technique of forming rectangular polycrystalline silicon with {100} axes in a direction perpendicular to the insulating substrate and {220} faces in parallel (or at an angle of 45°) with the direction of scanning by controlling each minute the shape of a beam for heat treatment and moving the beam from spot to spot. JP-A-55808/1996 discloses a technique of forming a column-like polycrystalline-silicon layer of uniform face orientations by (i) forming a first polycrystalline-silicon layer to form seed crystals with one of the specific faces ({100}, {110}, and {111}) via anisotropic etching and (ii) forming a second polycrystalline-silicon layer on the first layer. All the above prior art references, however, fail to produce transistors of adequately high electron mobility.

The above prior art references produce crystals of insufficient grain size (up to 2 $\mu$m), whereas thin-film transistors for large-screened liquid crystal displays require practical grain size of about 8 $\mu$m. Besides, the prior art fails to form crystal grains in exact positions to provide elements of uniform performance. Thus, the prior art can not provide high-performance TFT devices to replace conventional low-performance TFT devices with desired characteristics. The prior art fails to seek a method of crystallization on the basis of the growth mechanism of silicon crystals. To solve such problems, it is essential to develop a technique which is most consistent with the self-organizing function of silicon crystals.

The object of the present invention is to uniform face orientations of the crystal grains and to increase the size of the crystal grains (to form pseudo-single crystals) of low-temperature polycrystalline silicon for making thin-film transistors by a method of crystallization based upon the growth mechanism of silicon crystals so as to realize a high-electron-mobility TFT device and provide a large-screened image display of low manufacturing cost.

SUMMARY OF THE INVENTION

To achieve the above object, a thin film of silicon or another IV-group element (C, Ge, Sn, or Pb) is scanned with a laser beam moving in a lateral direction in which crystal grains grow largest in order to form high-quality crystals in exact positions in the thin film (while defects uncontrollable by the prior arts are being reduced significantly) so as to realize a high-quality TFT device.

Figure 11A:
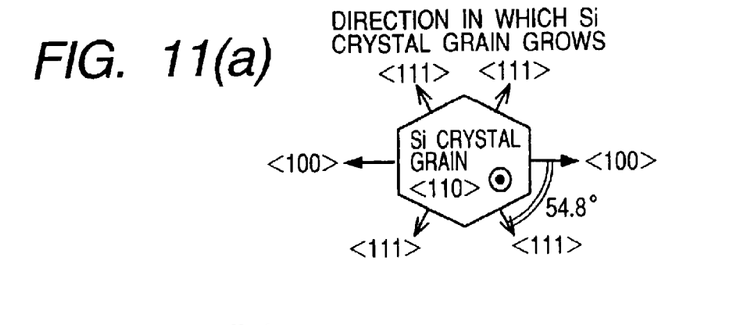
FIGS. 11(a) to 11(c) illustrate the formation of crystal grains in different face orientations according to the invention.
Figure 11B:
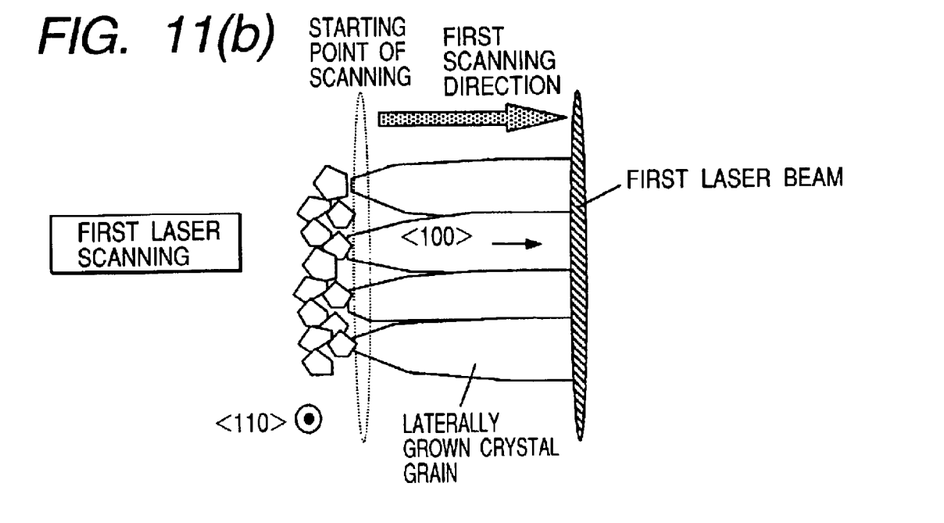
Figure 11C:
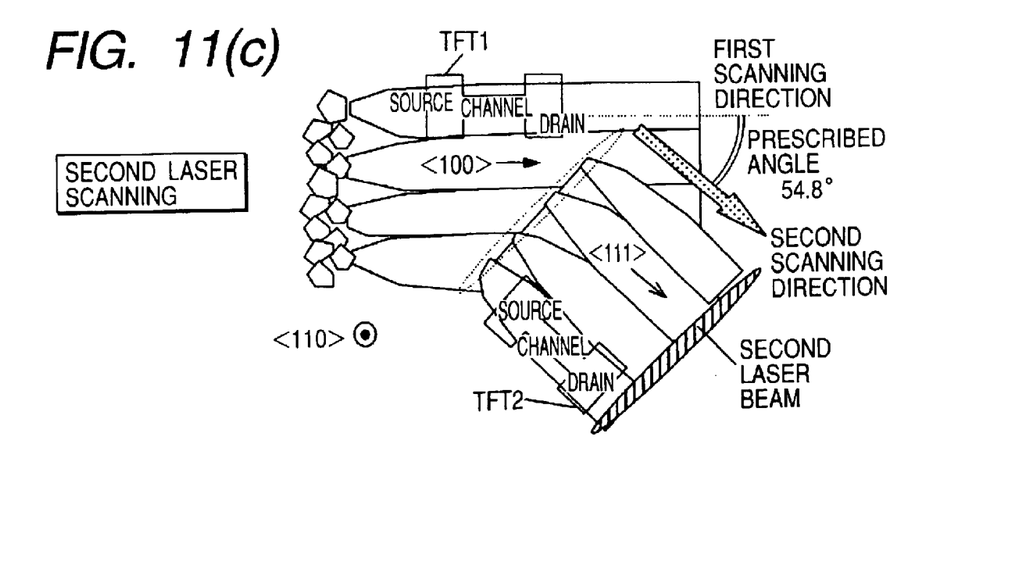

First of all, the basic principles of the present invention is described below. FIGS. 11(a) to 11(c) illustrate the formation of crystal grains in two different face orientations according to an embodiment of the invention later described. Description is given regarding the face orientation {110} in this example; however, needless to say, it is also applicable to other face orientations by changing the prescribed angle. FIG. 11A is a view of a crystal grain of silicon with the {110} face orientation as seen from above the substrate. There are an <100> axis and an <111> axis which are apart from each other at an angle of 54.8° and in parallel with the substrate. In the crystallization of silicon, the growth rate in the direction of the <100> axis is higher than that in the direction of the <111> axis. Accordingly, when the substrate is scanned with a laser beam in the direction shown in FIG. 11(b), seed crystals grow into laterally grown crystal grains with {100} axes in the direction of scanning. Then, when the substrate is then scanned with another laser beam as shown in FIG. 11(c), the second scanning direction being at an angle of 54.8° with the first direction of scanning. Crystals grow in the second direction of scanning turn into crystal grains with {111} axes. Thus, two different crystalline regions are formed on a single substrate. A channel (formed between a source and a drain) for a thin-film transistor "TFT1" is formed in the first direction of scanning in the first crystalline region and a channel for another thin-film transistor "TFT2" is formed in the second direction of scanning in the second crystalline region. Thus, on a single substrate, two TFTs can be formed, with one having its channel along the <100> axis and the other having its channel along the <111> axis. The present invention provides a technique for forming crystal grains of different face orientations on a single substrate. The features of the present invention is described as follows.

According to the first feature of the present invention, a thin-film transistor device comprises (i) an insulating substrate, (ii) a polycrystalline thin film formed on the insulating substrate, and (iii) thin-film transistors, each having a source, a drain, a channel, and a gate formed on the polycrystalline thin film. The polycrystalline thin film has crystalline regions including crystals made of one of C, Si, Ge, Sn, and Pb of the IV group or their combinations. The face orientations of the crystalline regions include at least two of {100}, {110}, and {111}

According to the second feature of the present invention, an image display comprising (i) a plurality of thin-film transistor devices formed in a single substrate and (ii) at least one of a pixel-driving circuit, a peripheral control circuit, and a logic circuit. Each thin film transistor device includes (i) an insulating substrate, (ii) a polycrystalline thin film formed on the insulating substrate, and (iii) thin-film transistors, each having a source, a drain, a channel, and a gate formed on the polycrystalline thin film. The polycrystalline thin film has crystalline regions, each including crystals made of one of C, Si, Ge, Sn, and Pb of the IV group or their combinations. The face orientations of the crystalline regions include at least two of {100}, {110}, and {111}.

It is desirable that the insulating substrate is made of glass and the thickness of the polycrystalline thin film is 30 nm to 300 nm.

Further, it is desirable that each of the crystalline regions has at least one thin-film transistor with a channel between a source and a drain, the channel of the thin-film transistor in the crystalline regions is disposed in one of two directions which are apart from each other at the angle of one of 0±5°, 30±5°, 35.3±5°, 45.0±5°, 54.8±5°, 60±5°, 70.5±5°, and 90±5°.

According to the third feature of the present invention, a process of producing a thin-film transistor device by crystallizing a thin film of a semiconductor on an insulating substrate is scanned with a laser beam having a long axis, wherein the angle between the long axis of the laser beam and a direction perpendicular to a laser-scanning direction of the thin film of the semiconductor (hereinafter referred to as "angle of inclination of a long axis") is one of 0±5°, 30±5°, 35.3±5°, 45.0±5°, 54.8±5°, 60±5°, 70.5±5°, and 90±5°.

It is preferable that, in the above process, the thin film of the semiconductor is crystallized several times by scanning with laser beams each time, the angle between any two consecutive laser-scanning directions (hereinafter referred to as "angle of inclination of scanning") is one of 0±5°, 30±5°, 35.3±5°, 45.0±5°, 54.8±5°, 60±5°, 70.5±5°, and 90±5°.

It is preferable that, in the above process, at least one region of the thin film of the semiconductor is crystallized by a pair of laser beams with an angle of inclination of a long axis equal to an angle of inclination of scanning.

It is further preferable that, in the above process, a plurality of regions of the thin film of the semiconductor are crystallized with at least two sets of the angles of inclination of a long axis and the angles of inclination of scanning.

In the above process, the insulating substrate or the thin film of the semiconductor may be marked with a plurality of position-aligning marks to indicate absolute positions and absolute angles so as to determine the angle of inclination of a long axis or the angle of inclination of scanning.

BRIEF DESCRIPTION OF THE DRAWINGS

The foregoing and additional features and characteristics of the present invention will become more apparent from the following detailed description considered with reference to the accompanying drawings in which like reference numerals designate like elements and wherein.

DESCRIPTION OF THE PREFERRED EMBODIMENTS

Referring to drawings, embodiments of the present invention will be described in detail below.

Prior to the description of embodiments of the present invention, the problems of the prior art and the dependency of crystal growth rate on the face orientation will be described. The face orientations (110), (101), and (011) which are crystallographically equivalent to one another, are collectively expressed as {110} in this specification and, needless to say, it holds true of every face orientation. Although description will be given about silicon crystals, it holds true for any IV-group crystals (crystals and mixed crystals of C, Si, Ge, Sn, and Pb).

Figure 1A:
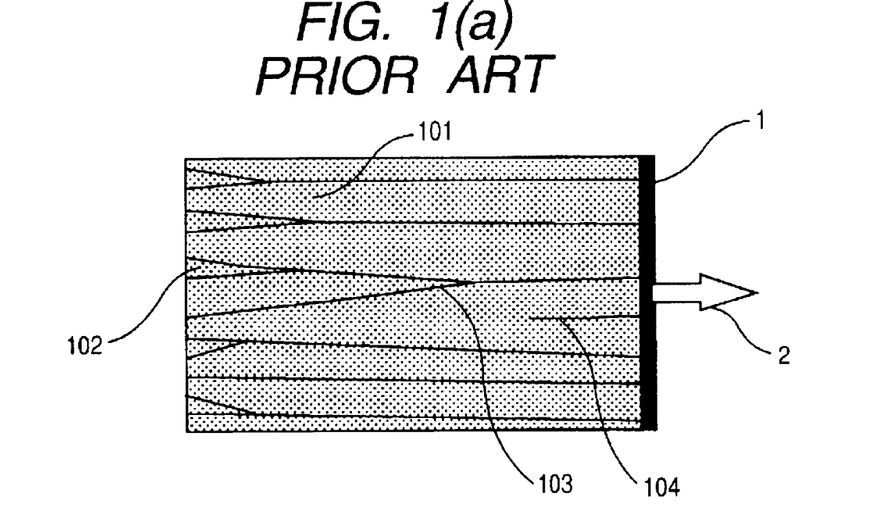
FIGS. 1(a) and 1(b) illustrate problems of the prior art for crystallization with a laser beam.
Figure 1B:
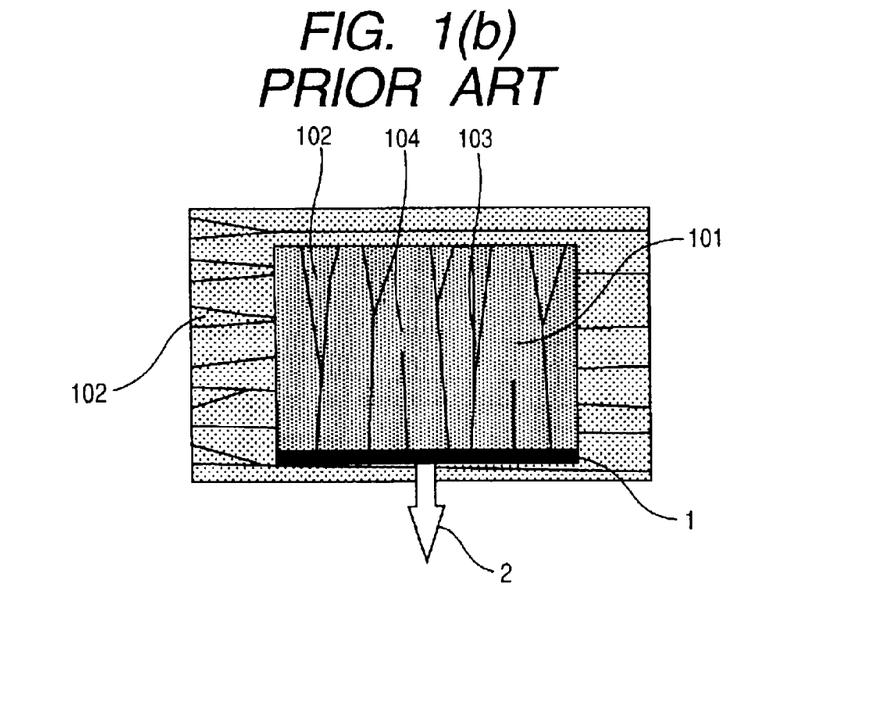

FIGS. 1(a) and 1(b) illustrate the problems of the prior art for crystallization with a laser beam.

As shown in FIG. 1(a), amorphous silicon is scanned and crystallized with a laser beam 1 whose long axis is disposed longitudinally and which is moved in a direction perpendicular to the long axis, or to the right laterally. This method produces silicon crystals of relatively large grain size compared with other methods (for example, of crystallizing amorphous silicon with a fixed laser beam). Therefore, many researchers have been researching to improve the method. The feature of polycrystalline silicon produced by this method is that crystal grains 101 are formed along the direction of scanning 2. The maximum grain size and face orientations of silicon crystals vary according to the kinds of laser beams (ex. excimer laser beams, solid-state laser beams, etc.) and the thickness of a thin film of amorphous silicon. For example, when an amorphous silicon film of 50 nm thick is crystallized with a solid-state laser (YAG), crystal grains of a maximum size of 10 $\mu$m or more with {100} faces in the growth direction and {110} faces in a perpendicular direction relative to the substrate are grown. If the channel of the transistor is disposed along the direction of scanning 2, the electron mobility is increased due to the decrease of the dispersion at grain boundaries thereby increasing the performance of the transistor. Many micro crystals 102 are observed in the scan-start zone of actually formed thin film of polycrystalline silicon, and many grain boundary joints 103 at any places during the scan, and many grain-splitting boundaries 104 which may occur abruptly out of crystal grains are observed here and there in the film, all of which reduce the quality of the thin film of polycrystalline silicon. One approach to solve the problem is to form a thin film of polycrystalline silicon on a substrate and scan the thin film twice differently with a laser beam. For example, the direction 2 of the second scan is made in a direction perpendicular to the direction of the first scan as shown in FIG. 1(b). This approach appears to be effective. However, the second scan also produces micro crystals 102, grain boundaries joints 103, and grain-splitting boundaries 104, which cannot bring about the desirable effect. Even if the second direction of scanning 2 is made to be in parallel with the first one, the result obtained is the same. As such, a thin-film transistor using lateral crystallization has not yet come into use. The essential problem is that the growth mechanism of silicon crystals and laser crystallization are not properly matched.

Figure 2A:
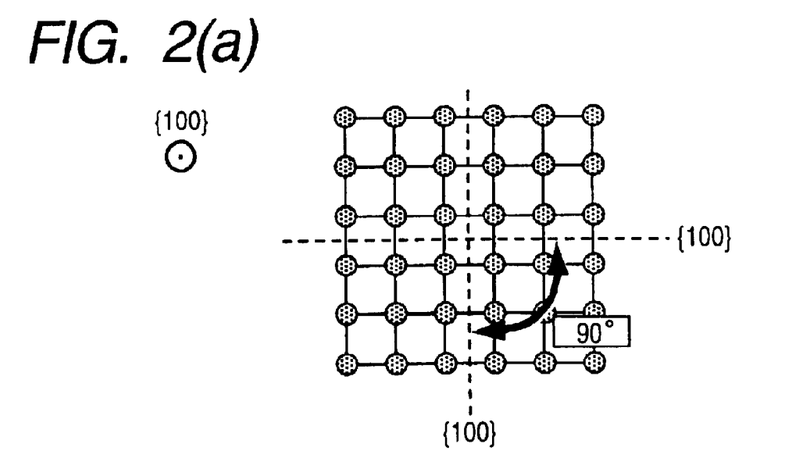
FIGS. 2(a) to 2(c) illustrate crystal lattices of silicon crystals in which face {100} (FIG. 2(a)), face {110} (FIG. 2(b)) and face {111} (FIG. 2(c))
Figure 2B:
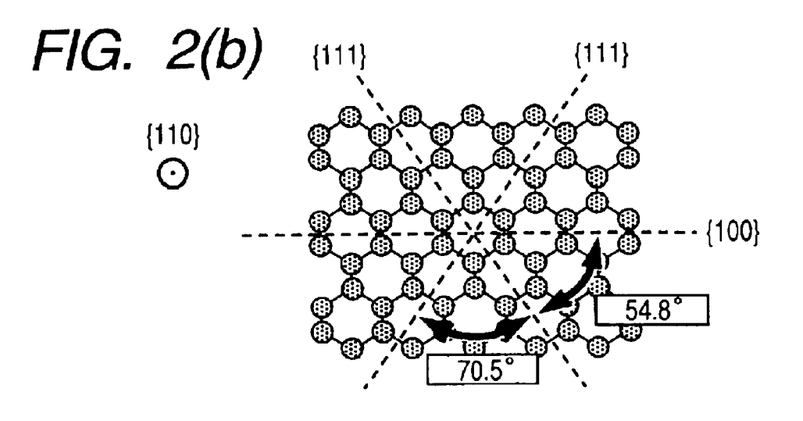
Figure 2C:
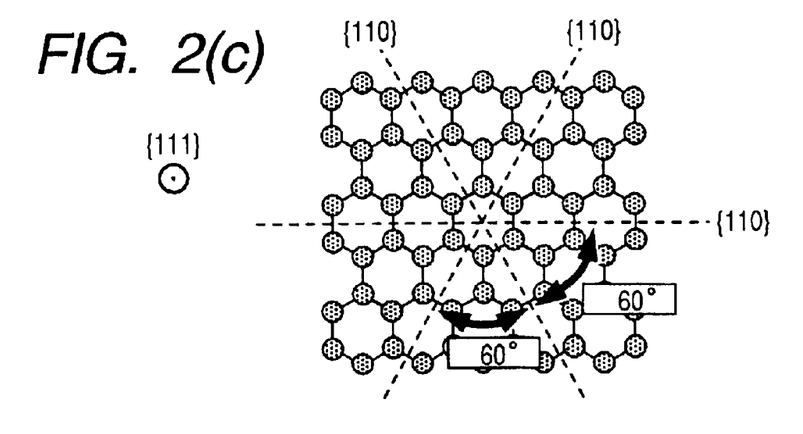

FIGS. 2(a) to 2(c) illustrate silicon crystal lattices, and face {100} (FIG. 2(a)), face {110} (FIG. 2(b)) and face {111} (FIG. 2(c)) are shown in parallel on the sheet. The dotted lines illustrate other faces perpendicular to the sheet. In a solidification process of silicon from liquid phase to solid phase, such as laser crystallization, the solidification speed (or crystal growth rate) varies greatly according to the face orientations of silicon. Though quantitative measurement of the growth rate is extremely difficult, the growth rate of the face {100} is known (in the case of laser annealing) as about 7 m/s. On the contrary, the growth of the face {111} is about an order of magnitude smaller than that of the face {100} (Laser Annealing of Semiconductors, J. M. Poate, Academic Press, New York, 1982). Further, in the lateral crystallization of silicon, the growth on the face {111} is generally active. In either face, determinants are the original structure of the silicon crystal and the temperature gradient caused by the heat of a laser beam. Thus, the growth mechanism of the silicon crystal has strong anisotropy in a thin-film surface, which causes many defects as described with reference to FIG. 1. For example, when the crystal grain in FIG. 2(b) grows laterally in the direction of {100}, another face {111} may grow in the direction being 54.8° different from the direction of {100} by an adjacent crystal grain to produce conflict therebetween, which causes the above defects. Therefore, in order to reduce such defects, a different method of scanning with a laser beam from the conventional ones is provides and the temperature gradient is controlled. According to the present invention, the occurrence of defects is suppressed by matching the laser beam scanning method to the angles between those crystal faces. Embodiments of the present invention is described below with reference to the crystal structure of FIG. 2(b). However, it will be appreciated that it is also applicable to other crystal structures of different angles.

(Embodiment 1)

Figure 3A:
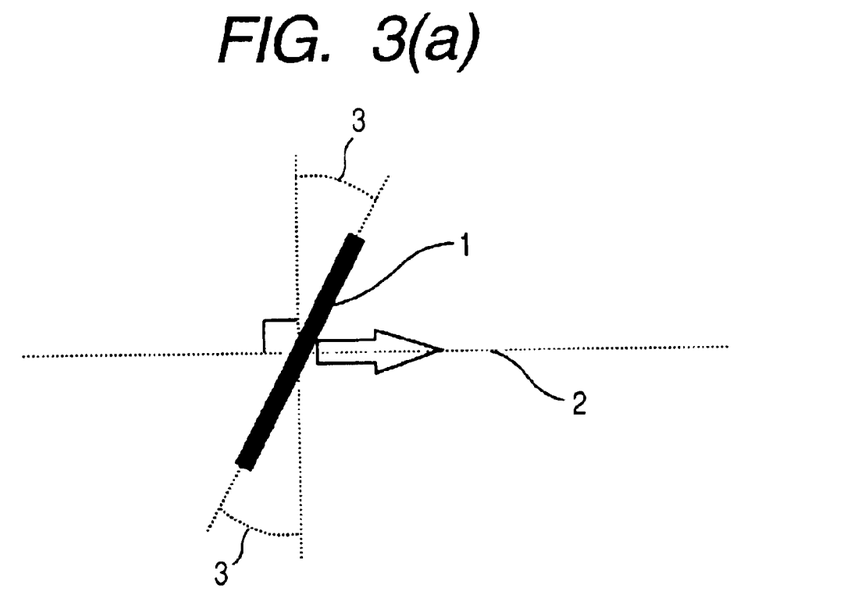
FIG. 3(a) illustrates a laser crystallization method according to a first embodiment of the invention.

FIG. 3(a) illustrates a laser crystallization method according to a first embodiment of the invention. When applying a laser beam 1 in a direction of scanning 2, the angle between the long axis of the laser beam 1 and a direction perpendicular to the direction of scanning 2 is defined as the angle of inclination of a long axis 3. By matching the angle of inclination of a long axis 3 with the angle between the crystal growth faces described with reference to FIG. 2, crystal growth in the direction of scanning 2 and crystal growth according to the temperature gradient inclined by the angle of inclination of a long axis 3 are separated, thereby reducing the occurrence of defects. For example, the angle of inclination of a long axis 3 may be 54.8° to isolate the disturbance of the face {111} from the growth face {100} (and vice versa) so as to improve the coordination of the growth faces. In the present embodiment, the inclination of the long axis of the laser beam is utilized. The same control of the laser-scanning may be achieved, for example, by a mask, a laser slit and so on.

(Embodiment 2)

Figure 3B:
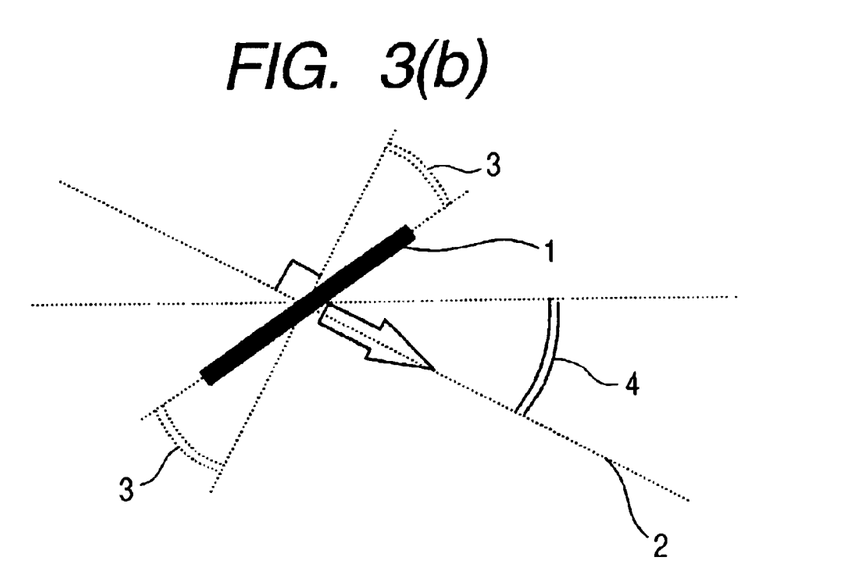
FIG. 3(b) illustrates a laser crystallization method according to a second embodiment of the invention.

FIG. 3(b) illustrates a laser crystallization method according to a second embodiment of the invention. When the same surface of a thin film of silicon is crystalized with a laser beam twice, the second direction of scanning 2 is inclined at an angle of inclination of scanning 4 with respect to the first direction of scanning. By matching this angle of inclination of scanning 4 with the angle between faces of crystal growth described in FIG. 2, the growth on another growth face (different from the crystal growth face formed in the first scanning) is achieved in the second scanning process. Accordingly, an effect of reducing the defects occurred in the first scanning and an effect of forming crystal grains of different face orientations are both achieved. In this case, also, crystals with good quality is formed by properly choosing the angle of inclination of a long axis 3. The present embodiment may also be achieved alternatively by controlling the laser-scanning with a mask, a laser slit and so on.

Figure 4A:
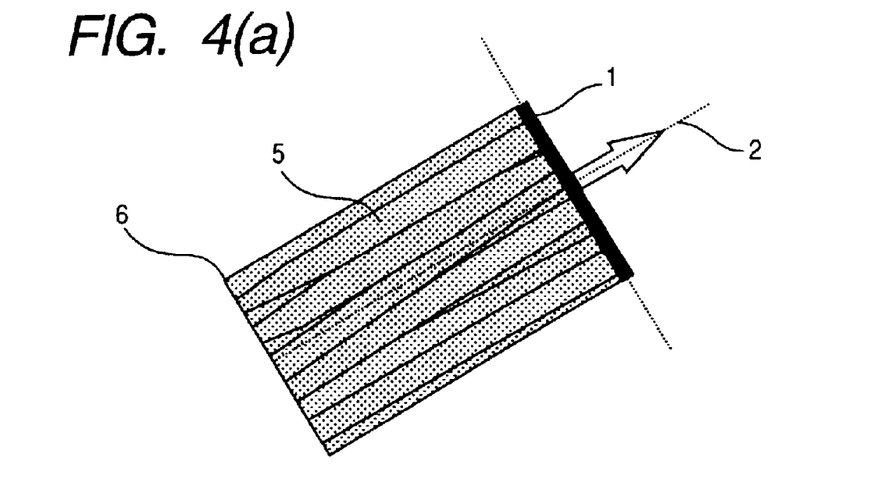
FIGS. 4(a) and 4(b) illustrate a laser crystallization method according to the second embodiment of the invention.
Figure 4B:
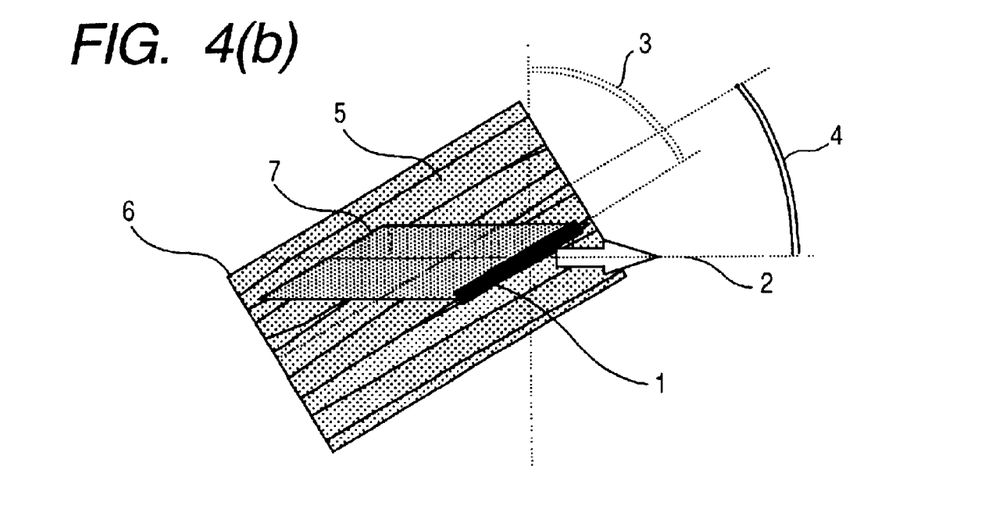

FIG. 4 illustrates a specific laser crystallization method according to the second embodiment of the invention. A first laser beam 1 is moved in the direction of scanning 2. The angle of inclination of a long axis 3 at this point is 0°. Accordingly, a first polycrystalline region 6 comprising strip crystal grains 5 having a face {100} orthogonal to the direction of scanning 2 and a face {110} in parallel with the sheet is obtained (FIG. 4(a)). Then, second laser crystallization with an angle of inclination of a long axis 3 and an angle of inclination of scanning 4 with respect to the first laser crystallization is conducted on the first polycrystalline region 6. At this time, by having both the angle of inclination of a long axis 3 and the angle of inclination of scanning 4 be 54.8°, a second polycrystalline region 7, which is produced from a strip crystal grain 5, as shown in FIG. 4 and grows into direction of the face {111}, becomes defect-free state (FIG. 4(b)).

Figure 5:
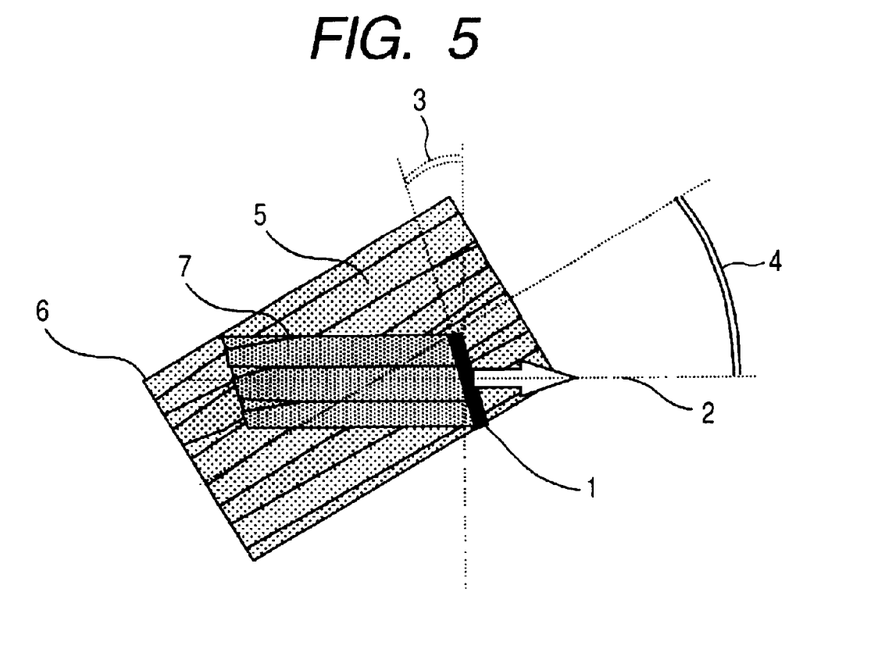
FIG. 5 shows an example of a specific laser crystallization method according to the second embodiment of the invention.

Shown in FIG. 5 is also an example of a specific method of laser crystallization according to the second embodiment of the present invention. As in FIGS. 4(a) and 4(b), after the first laser crystallization, the second laser crystallization having an angle of inclination of scanning 4 and an angle of inclination of a long axis 3 with respect to the first laser crystallization is conducted on the first polycrystalline region 6. At this time, the angle of inclination of scanning 4 is 54.8° and the angle of inclination of a long axis 3 is 35.3°. Thus, as seen in FIG. 3(b), the other growth of the face {111}, which is absent from FIGS. 4(a) and 4(b), is caused out of two faces of {111}. In this case, the whole second polycrystalline region does not become a single crystal because, unlike the case in FIGS. 4(a) and 4(b), it is produced from a plurality of strip crystal grains 5. However, it has an advantage of obtaining the second polycrystalline region 7 with an area larger than the one in FIGS. 4(a) and 4(b). In this case, crystal grains in the second polycrystalline region 7 is generally smaller than those shown in FIG. 4(b). However, actual characteristic of the thin-film transistor is strongly influenced by the number of boundaries crossing a current channel. Therefore, if the current channel is established in parallel with the second direction of scanning 2, such an embodiment is also practically advantageous. Further, the second polycrystalline region 7 grows in the direction of the face {111}, which is different from the first polycrystalline region 6. The mobility of the thin-film transistor depends on face orientations. The most advantageous face orientation further depends on whether the carrier is of an electron type or of a hole type. By making use of this technique, advantageous orientations can be chosen for an electron type or a hole type.

Figure 6:
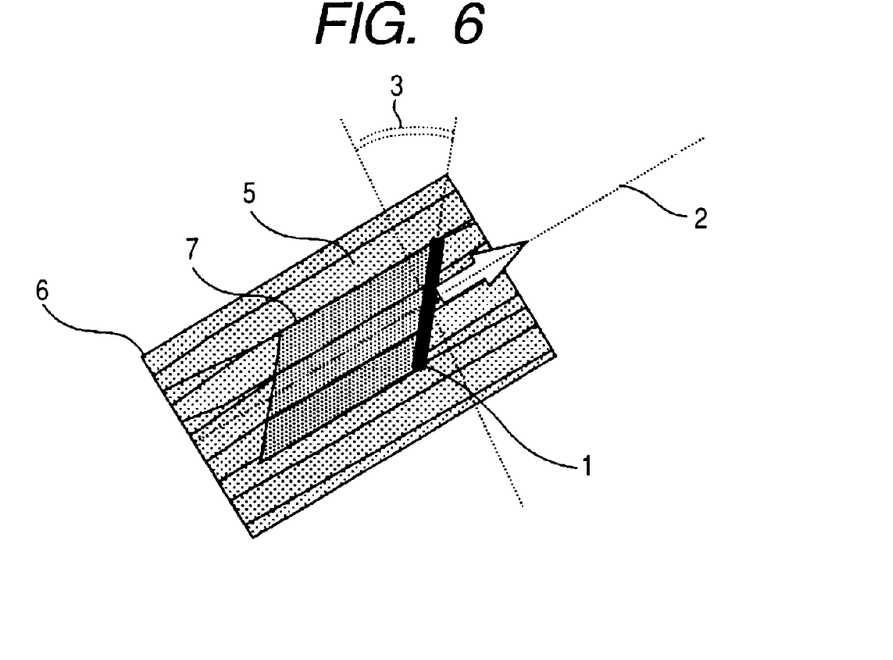
FIG. 6 shows another example of a specific laser crystallization method according to the second embodiment of the invention.

Shown in FIG. 6 is another example of a specific method of laser crystallization according to the second embodiment of the invention. Like in FIGS. 4(a) and 4(b), after the first laser crystallization, the second laser crystallization with an angle of inclination of scanning 4 and an angle of inclination of a long axis 3 with respect to the first laser crystallization is conducted on the first polycrystalline region 6. At this point, the angle of inclination of scanning 4 is set to be 0° and the angle of inclination of a long axis 3 is set to be 54.8°. In this way, conflicts of growth faces from face {111} seen in FIG. 3(b) are reduced to correct the defects occurred in the first polycrystalline region 6. Also in this case, the second polycrystalline region 7 is produced from a plurality of strip crystal grains 5. Therefore, a single crystal is not formed as a whole, but polycrystals of higher quality are obtained.

Figure 7A:
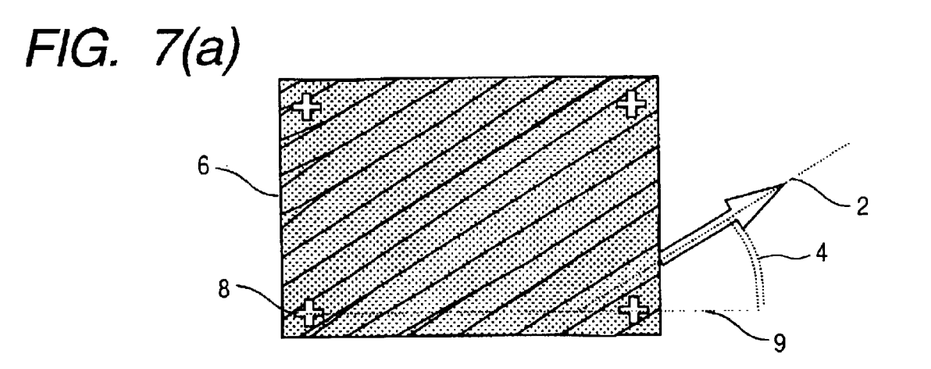
FIG. 7 illustrates an example when applying the laser crystallization method according to the second embodiment of the invention to an actual panel.
Figure 7B:
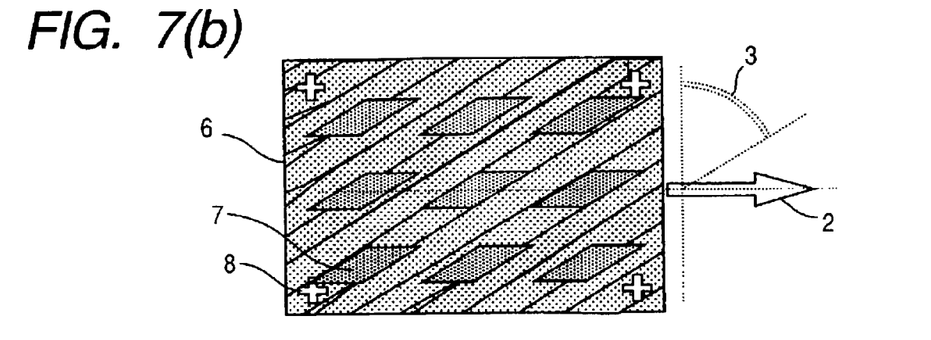
Figure 7C:
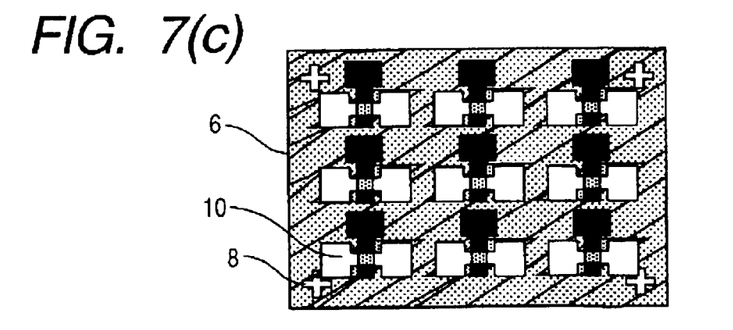

FIGS. 7(a) to 7(c) illustrate a specific example of applying a laser crystallization method according to the second embodiment of the invention on an actual panel. In the vicinity of a specific region on a thin film of amorphous silicon formed on an insulating substrate, position-aligning marks 8 are periodically formed by a laser marker or photolithography. Before laser crystallization, the position-aligning marks 8 are photographed by a camera and their pattern is stored. Reference direction 9 of the substrate is calculated according to the stored pattern, and the first laser crystallization is conducted along the direction of scanning 2 established by adding the angle of inclination of scanning 4 in advance. At this point, the angle of inclination of a long axis 3 is 0°. Accordingly, formed on the substrate is a first polycrystalline region 6 with a face {100} perpendicular to the direction of scanning 2 and a face {110} parallel with the substrate (FIG. 7(a)) is formed. Then, the spot of which quality is to be improved inside the first polycrystalline region 6 is calculated in advance from the pattern of the position-aligning marks 8. Consequently, the scanning position of the second laser crystallization is determined by the relation between the calculated position and the previously obtained reference direction 9. The second direction of scanning 2 is set to be in parallel with the reference direction 9, and the angle of inclination of a long axis 3 is set to be 54.8°. In this way, the second polycrystalline region 7 like the one in FIG. 4(b) is formed (FIG. 7(b)) A source, a drain, a channel, a gate insulator, and a gate electrode are formed one by one while making use of the position-aligning marks 8 such that channels of the transistor overlap on the formed second polycrystalline region 7 thereby forming a group of thin-film transistors 10. Thus, a group of highly functional thin-film transistors 10 using the second polycrystalline region (with few defects) as channels are obtained.

Figure 8A:
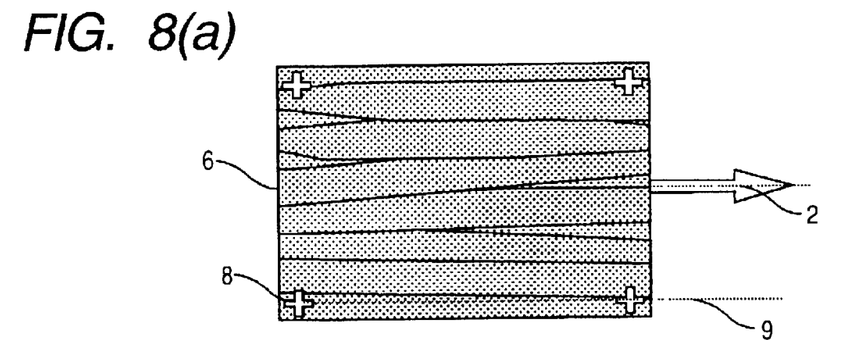
FIG. 8 illustrates another example when applying the laser crystallization method according to the second embodiment of the invention to an actual panel.
Figure 8B:
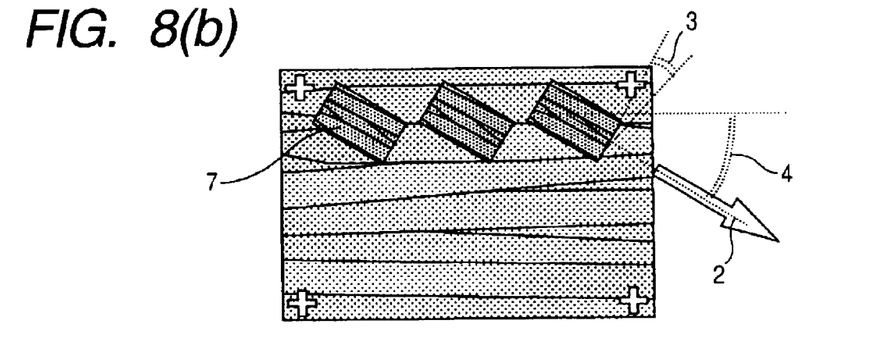
Figure 8C:
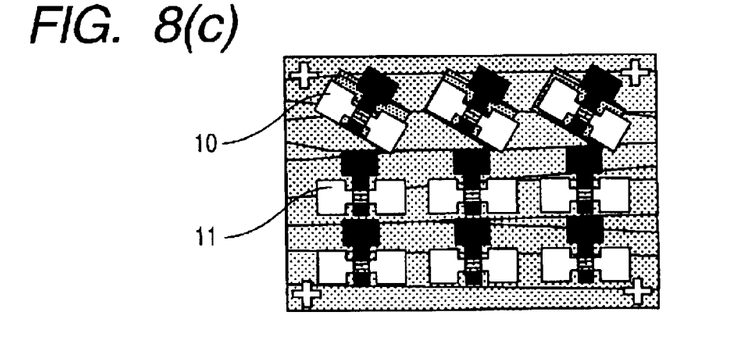

FIGS. 8(a) to 8(c) illustrate another specific example when applying a laser crystallization method according to the second embodiment of the invention to an actual panel. As in FIGS. 7(a) to 7(c), a first laser crystallization is conducted. This time, the angle of inclination of scanning 4 is in parallel with the reference direction 9, and the angle of inclination of a long axis 3 is 0°. Accordingly, on the substrate, a first polycrystalline region 6 having a face {100} perpendicular to the direction of scanning 2 and a face {110} in parallel with the substrate is formed (FIG. 8(a)). Next, inside the first polycrystalline region 6, the spot where a thin-film transistor having other crystal direction is desired is calculated in advance, and the second laser crystallization is conducted on that spot. The angle between the second direction of scanning 2 and the reference direction 9 is 54.8°, and the angle of inclination of a long axis is 35.3°. In this way, the second polycrystalline region 7 as in FIG. 5 is selectively formed (FIG. 8(b)). While inclining the pattern of the transistors so as to have their current channels in parallel with the direction of the crystal growth on the formed second polycrystalline region 7, a source, a drain, a channel, a gate insulator and a gate electrode are formed one by one to form each of the thin-film transistors 10. On the other region, a conventional thin-film transistor 11 having a current channel in parallel with the reference direction 9 is formed. Accordingly, a group of thin-film transistors 10 having face orientations, which are different from those of conventional thin-film transistors 11, are selectively formed. The overall characteristics are improved by allotting carrier types of an electron type and a hole type, respectively.

Figure 9:
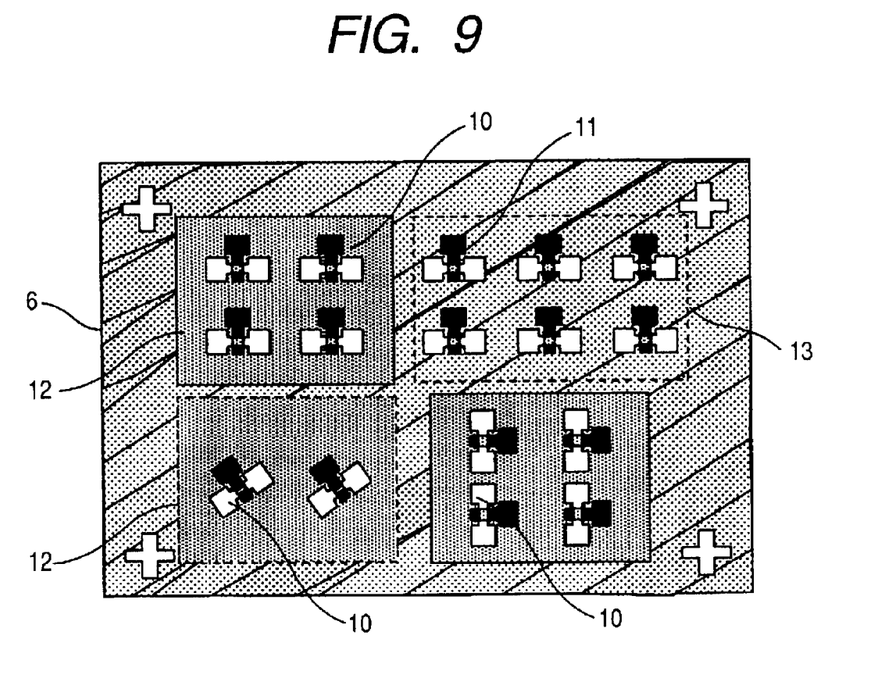
FIG. 9 shows an example of a peripheral circuit in which the thin-film transistors described in FIGS. 7 and 8 are located in different regions on a panel.

FIG. 9 shows an example of a peripheral circuit with the thin-film transistors 10 making use of the second polycrystalline region 7 in FIGS. 7(a) to 7(c) and 8(a) to 8(c) and conventional thin-film transistors 11 being separately allotted to a panel on different regions. Specific regions 12 in the whole peripheral circuit are determined in advance by using the position-aligning marks 8. In these specific regions 12, a group of thin-film transistors 10 in which a face orientation and a current channel direction are the same. Contrary to these specific regions 12, a conventional region 13 to which only one laser crystallization is applied is also properly blocked and disposed. In this way, scanning efficiency of the laser crystallization is enhanced, and the manufacturing cost is reduced. The specific regions may be selectively designated with different carrier types, i.e., an electron type or a hole type.

Figure 10:
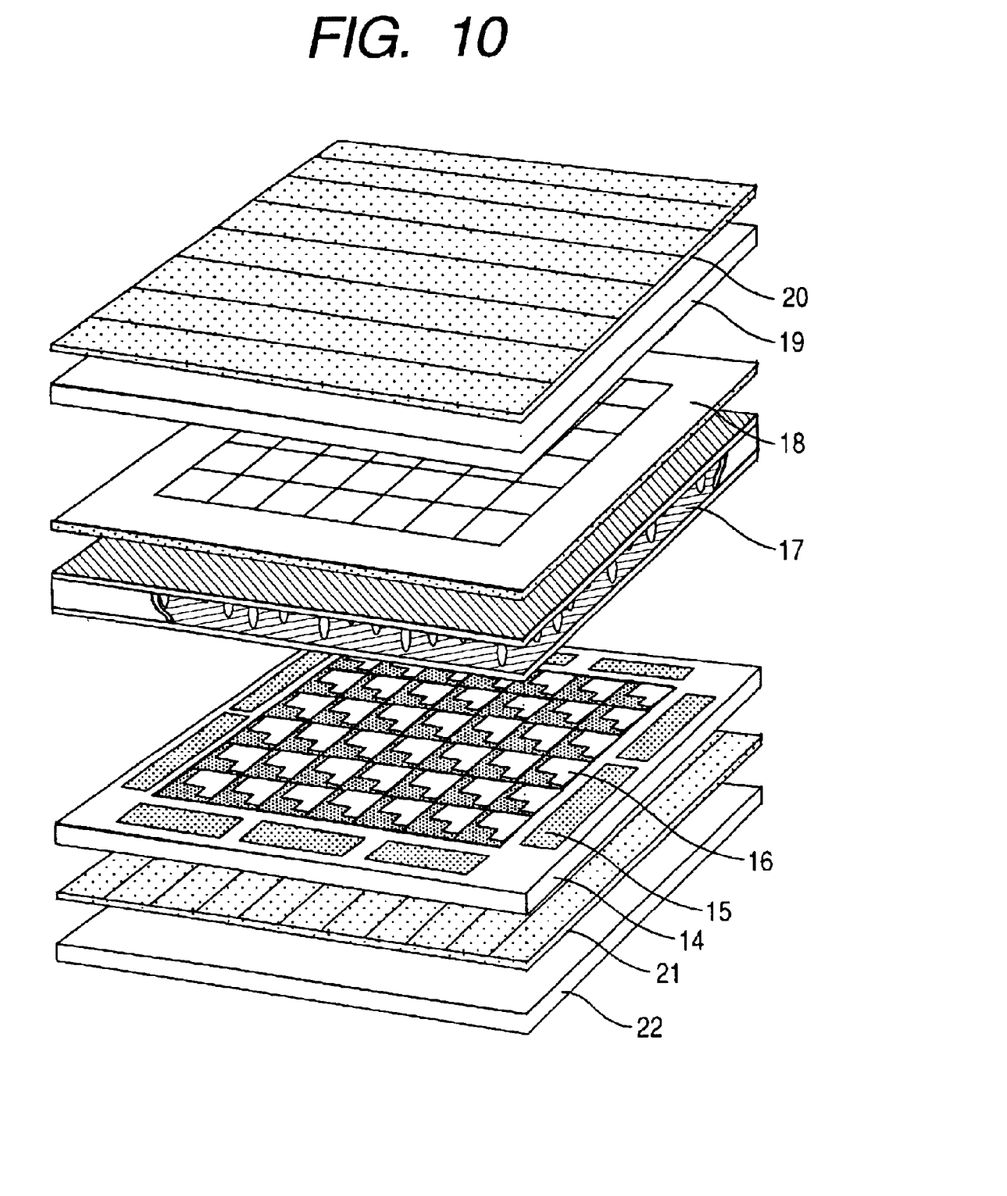
FIG. 10 shows an image display making use of the thin-film transistors of the invention.

FIG. 10 shows an example of an image display making use of the thin-film transistors of the present invention. A thin film of silicon is formed on an insulating substrate 14, a peripheral circuit region 15 is integrated-thereon, and they collectively make up an image display panel having pixels 16. Because different performance are required in different transistors of the circuits, the thin-film transistors are selectively integrated similar to the combination in FIG. 9. In such a configuration, main circuits can be integrated on a large area glass substrate, and an image display integrating almost all of the conventional peripheral circuits can be formed. Moreover, the device can be manufactured in fewer processes using low-cost glass substrates. On the image display panel, a liquid-crystal layer 17, a common electrode 18, and a protective film 19 are stacked on top in sequence, which are sandwiched between an upper polarizing plate 20 and a lower polarizing plate 21. The image display panel is made by forming the above-mentioned components as one piece on a light directing plate 22.

Thus, the occurrence of defects of a crystalline thin film forming a thin-film transistor is reduced, and thin-film transistors are selectively formed on a spot with high-quality polycrystal so as to obtain a high-performance thin-film transistor device. Further, it becomes possible to intensively form the pixel portion and a peripheral circuit on the same glass substrate so as to obtain a large (larger than 15 inches) image display.

The principles, preferred embodiments and modes of operation of the present invention have been described in the foregoing specification. However, the invention which is intended to be protected is not limited to the particular embodiments disclosed. The embodiments described herein are illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A thin-film transistor device comprising:

an insulating substrate;

a polycrystalline thin film formed on the insulating substrate; and thin-film transistors, each having a source, a drain, a channel, and a gate formed in the polycrystalline thin film, wherein the polycrystalline thin film having crystalline regions including crystals of at least one of C, Si, Ge, Sn, and Pb of the IV group, face orientations of at least two neighboring ones of the crystalline regions are respectively formed as at least two of {100}, {110}, and {111} in one respective laser-scanning stage per each of the face orientations, and at least two of the thin-film transistors have a first channel formed along one of said face orientations and a second channel formed alone the other one of said face orientations.

2. A thin-film transistor device as claimed in claim 1, wherein the insulating substrate is made of glass and a thickness of the polycrystalline thin film is 30 nm to 300 nm.

3. A thin-film transistor device as claimed in claim 1, wherein an angle between a long axis of a laser beam used in said two laser-scanning stages and said first or second channel formed along one of said face orientations is one of 0±5°, 30±5°, 35.3±5°, 45.0±5°, 54.8±5°, 60±5°, 70.5±5°, and 90±5°.

4. A thin-film transistor device as claimed in claim 3, wherein the face orientations are selected also based upon types of carriers in the channel.

5. An image display comprising:

a plurality of thin-film transistor devices formed in combination on a single substrate, each thin film transistor device including an insulating substrate, a polycrystalline thin film formed on the insulating substrate, and thin-film transistors, each having a source, a drain, a channel, and a gate formed in the polycrystalline thin film, wherein the polycrystalline thin film having crystalline regions including crystals of at least one of C, Si, Ge, Sn, and Pb of the IV group, face orientations of at least two neighboring ones of the crystalline regions are respectively formed as at least two of {100}, {110}, and {111} in one respective laser-scanning stage per each of the face orientations, at least two of the thin-film transistors have a first channel formed along one of said face orientations and a second channel formed along the other one of said face orientations, and at least one of a pixel-driving circuit, a peripheral control circuit, and a logic circuit.

6. An image display as claimed in claim 5, wherein the insulating substrate is made of glass and a thickness of the polycrystalline thin film is 30 mn to 300 nm.

7. An image display as claimed in claim 5, wherein an angle between a long axis of a laser beam used in said two laser-scanning stages and said first or second channel formed along one of said face orientations is one of 0±5°, 30±5°, 35.3±5°, 45.0±5°, 54.8±5°, 60±5°, 70.5±5°, and 90±5°.

8. An image display as claimed in claim 7, wherein the face orientations are selected also based upon types of carriers in the channel.

* * * * *